United States Patent
Choi et al.

(10) Patent No.: US 9,293,701 B2
(45) Date of Patent: Mar. 22, 2016

(54) VARIABLE RESISTANCE MEMORY DEVICE AND A METHOD OF FABRICATING THE SAME

(71) Applicant: Samsung Electronics Co., Ltd., Suwon-si, Gyeonggi-do (KR)

(72) Inventors: Hyun-Min Choi, Uiwang (KR); Juyoun Kim, Suwon-si (KR); Shigenobu Maeda, Seongnam-si (KR); Jihoon Yoon, Seoul (KR); Sungman Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/527,176

(22) Filed: Oct. 29, 2014

(65) Prior Publication Data
US 2015/0144862 A1  May 28, 2015

(30) Foreign Application Priority Data
Nov. 25, 2013 (KR) .......................... 10-2013-0143969

(51) Int. Cl.
*H01L 45/00* (2006.01)
*H01L 27/24* (2006.01)

(52) U.S. Cl.
CPC ........ *H01L 45/1253* (2013.01); *H01L 27/2436* (2013.01); *H01L 27/2463* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/147* (2013.01); *H01L 45/148* (2013.01)

(58) Field of Classification Search
CPC .................... H01L 45/1253; H01L 27/2436
See application file for complete search history.

(56) References Cited

U.S. PATENT DOCUMENTS

| 6,583,003 | B1 | 6/2003 | Hsu et al. |
| 8,241,944 | B2 | 8/2012 | Greeley et al. |
| 2010/0108972 | A1 | 5/2010 | Zhao et al. |
| 2012/0007035 | A1 | 1/2012 | Jo et al. |
| 2012/0068137 | A1 | 3/2012 | Hwang et al. |
| 2012/0241710 | A1 | 9/2012 | Liu et al. |
| 2013/0064002 | A1 | 3/2013 | Terai |
| 2013/0075689 | A1 | 3/2013 | Herner |
| 2015/0144862 | A1* | 5/2015 | Choi .................. H01L 45/1253 257/4 |

FOREIGN PATENT DOCUMENTS

| JP | 2008-294103 | 12/2008 |
| KR | 1020090070780 | 7/2009 |
| KR | 1020100007467 | 1/2010 |
| KR | 1020100023610 | 3/2010 |

* cited by examiner

*Primary Examiner* — Mark Prenty
(74) *Attorney, Agent, or Firm* — Myers Bigel & Sibley, PA

(57) ABSTRACT

A variable resistance memory device includes a gate pattern and a dummy gate pattern provided at the same level on a substrate, a first contact pattern provided on the dummy gate pattern, and a variable resistance pattern provided between the dummy gate pattern and the first contact pattern. The gate pattern and the dummy gate pattern define conductive electrodes of functional and non-functional transistors, respectively. The first contact pattern and the dummy gate pattern define upper and lower electrodes on the variable resistance pattern, respectively. Related fabrication methods are also discussed.

20 Claims, 17 Drawing Sheets

VARIABLE RESISTANCE MEMORY DEVICE AND A METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0143969, filed on Nov. 25, 2013, in the Korean Intellectual Property Office, the entire contents of which are hereby incorporated by reference.

BACKGROUND

Example embodiments of the inventive concepts relate to semiconductor memory devices, and in particular, to variable resistance memory devices and methods of fabricating the same.

Next-generation semiconductor memory devices (e.g., ferroelectric random access memory (FRAM), magnetic random access memory (MRAM), phase-change random access memory (PRAM), and so forth) are being developed in view of demand for high performance and low power consumption memory devices. In the semiconductor memory devices, memory elements may be formed of non-volatile and variable resistance materials. For example, the memory element may exhibit an electrical resistance, which may be selectively changed depending on a current or voltage applied thereto, and may be preserved even when a current or voltage is not supplied.

As semiconductor devices become more highly integrated, the variable resistance memory devices may likewise become more and more highly integrated.

SUMMARY

Example embodiments of the inventive concepts provide fabrication methods capable of forming a memory layer of a variable resistance memory device using a process of forming gate and contact pattern structures.

Example embodiments of the inventive concepts provide a variable resistance memory device with an increased integration density.

According to some embodiments of the inventive concepts, a variable resistance memory device includes a substrate, a gate pattern and a dummy gate pattern on a surface of the substrate, a variable resistance material pattern on the dummy gate pattern opposite the substrate, and a contact pattern on the variable resistance pattern opposite the dummy gate pattern. The gate pattern and the dummy gate pattern define conductive electrodes of functional and non-functional transistors, respectively. The contact pattern and the dummy gate pattern define upper and lower electrodes on the variable resistance material pattern, respectively.

In some embodiments, the gate pattern and the dummy gate pattern may extend adjacent one another substantially in parallel on the surface of the substrate and may include respective portions of a same conductive material layer.

In some embodiments, an insulating interlayer may be provided on the gate pattern and the dummy gate pattern. The contact pattern may be a first contact pattern that extends through the insulating interlayer to contact the variable resistance material pattern opposite the dummy gate. A second contact pattern may extend through the insulating interlayer to contact the dummy gate pattern and a source/drain region of the functional transistor.

In some embodiments, a third contact pattern may extend through the insulating interlayer to contact another source/drain region of the functional transistor.

In some embodiments, the first, second, and third contact patterns may be portions of a same conductive layer.

In some embodiments, the first contact pattern may contact the variable resistance material pattern at opposing sidewalls thereof.

In some embodiments, the gate pattern and the dummy gate pattern may extend in a first direction. A first interconnection line may contact the first contact pattern opposite the variable resistance material pattern. The first interconnection line may extend in a second direction different than the first direction on a surface of the insulating interlayer.

In some embodiments, the first interconnection line may be a bit line of the memory device, and the dummy gate pattern may be coupled to a ground voltage.

In some embodiments, a second interconnection line may contact the third contact pattern opposite the other source/drain region, and may extend in the first direction on the surface of the insulating interlayer.

In some embodiments, the first, second, and third contact patterns may include titanium, tungsten, and/or nitrides thereof, and the first and second interconnection lines may include copper and/or aluminum.

According to example embodiments of the inventive concepts, a variable resistance memory device may include a gate pattern and a dummy gate pattern provided at the same level on a substrate, a first contact pattern provided on the dummy gate pattern, and a variable resistance pattern provided between the dummy gate pattern and the first contact pattern.

In example embodiments, the device may further include an active portion provided below the gate pattern and the dummy gate pattern. The active portion may have a fin shape protruding from a top surface of the substrate.

In example embodiments, the dummy gate pattern may be used as a gate pattern of an incomplete or non-functional transistor, which may have only one source/drain region, or may have source and drain regions where at least one of the source and drain is electrically separated or isolated from an external voltage source.

In example embodiments, the device may further include source and drain regions provided at both sides of the gate pattern. The variable resistance pattern may be electrically connected to one of the source and drain regions via the dummy gate pattern.

In example embodiments, the device may further include a second contact pattern connected to one of the source and drain regions. The variable resistance pattern may be electrically connected to the one of the source and drain regions via the dummy gate pattern and the second contact pattern.

In example embodiments, the second contact pattern may have a top surface that is located at the same level as that of the first contact pattern.

In example embodiments, the second contact pattern may include a lower portion connected to the one of the source and drain regions and an upper portion connected to an upper portion of the dummy gate pattern.

In example embodiments, the variable resistance pattern may include a first variable resistance pattern and a second variable resistance pattern, and when viewed in plan view, the second contact pattern may be provided between the first and second variable resistance patterns.

In example embodiments, the dummy gate pattern may be provided in a cell region of the substrate and the gate pattern may be provided in a peripheral circuit region of the substrate.

In example embodiments, in the variable resistance memory device, each of the numbers of the variable resistance pattern, the dummy gate pattern, and the first contact pattern may be two or more. The variable resistance memory device may further include conductive patterns provided to cross the dummy gate patterns, and the variable resistance patterns may be provided at respective intersections between the dummy gate patterns and the conductive patterns.

In example embodiments, the conductive patterns may include first conductive patterns and second conductive patterns. Here, the variable resistance patterns are provided between the first conductive patterns and the dummy gate patterns, and any variable resistance pattern is not provided between the second conductive patterns and the dummy gate patterns.

In example embodiments, the first conductive patterns and the second conductive patterns may be alternatingly disposed.

In example embodiments, the device may further include a first interconnection line provided on the first contact pattern. The variable resistance pattern may have a top surface lower than a bottom surface of the first interconnection line.

According to example embodiments of the inventive concepts, a method of fabricating a variable resistance memory device may include forming sacrificial gate patterns on a substrate, removing the sacrificial gate patterns to form recess regions, forming a gate pattern and a dummy gate pattern in the recess regions, forming a variable resistance pattern on the dummy gate pattern, and forming a first contact pattern on the variable resistance pattern.

In example embodiments, the gate pattern and the dummy gate pattern may be simultaneously formed of a metal-containing material.

In example embodiments, the method may further include forming source and drain regions at both sides of the gate pattern, and forming a second contact pattern to be connected to one of the source and drain regions, and forming a third contact pattern to be connected to a top surface of the gate pattern. The first, second, and third contact patterns may be formed by the same deposition process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A through 10A are sectional views taken along line A-A' of FIG. 2 to illustrate methods of fabricating a variable resistance memory device according to example embodiments of the inventive concepts.

FIGS. 4B through 10B are sectional views taken along line B-B' of FIG. 2.

Figure 1:
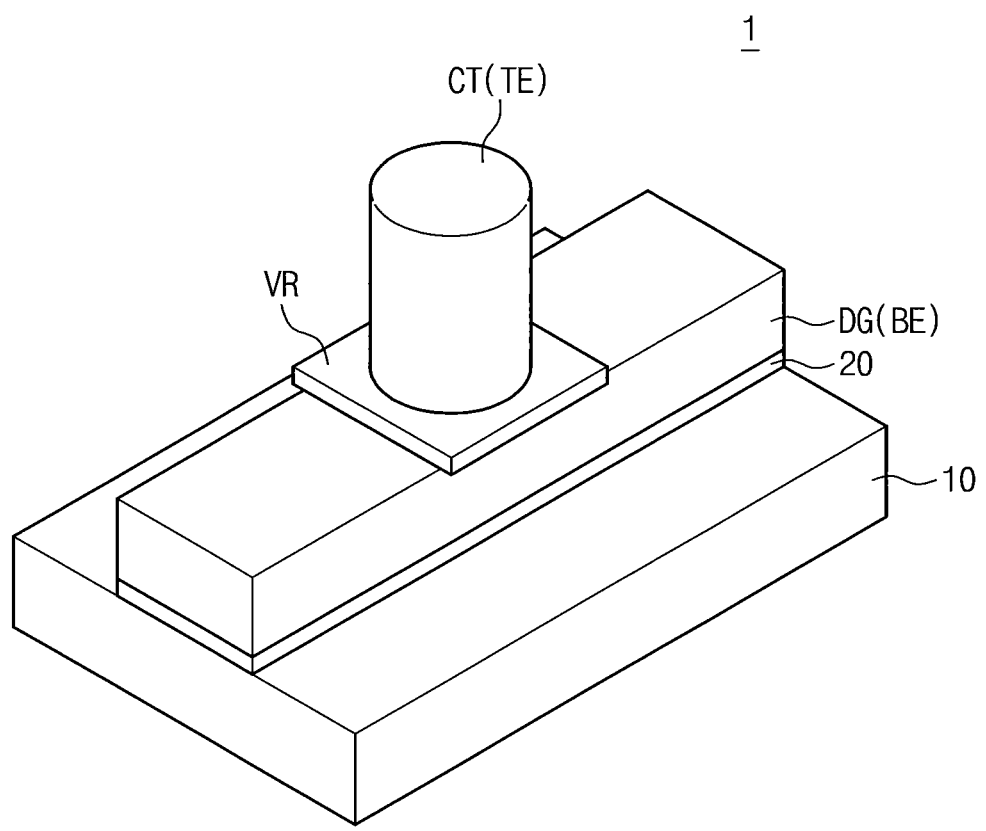
FIG. 1 is a schematic perspective view illustrating a variable resistance memory device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic perspective view illustrating a variable resistance memory device according to example embodiments of the inventive concepts.

Referring to FIG. 1, a variable resistance memory device 1 may include a substrate 10, a dummy gate pattern DG and a contact pattern CT stacked on the substrate 10, and a variable resistance pattern VR interposed between the dummy gate pattern DG and the contact pattern CT. A dummy gate insulating layer 20 may be provided between the dummy gate pattern DG and the substrate 10.

In certain embodiments, the dummy gate pattern DG and the contact pattern CT may serve as bottom and top electrodes BE and TE, respectively, for performing read/write operations to the variable resistance pattern VR. For example, the contact pattern CT may be electrically connected to a bit line, and the dummy gate pattern DG may be coupled to a ground voltage.

The variable resistance pattern VR may be formed of one or more materials in which data can be stored. The dummy gate pattern DG may include a metal.

Figure 2:
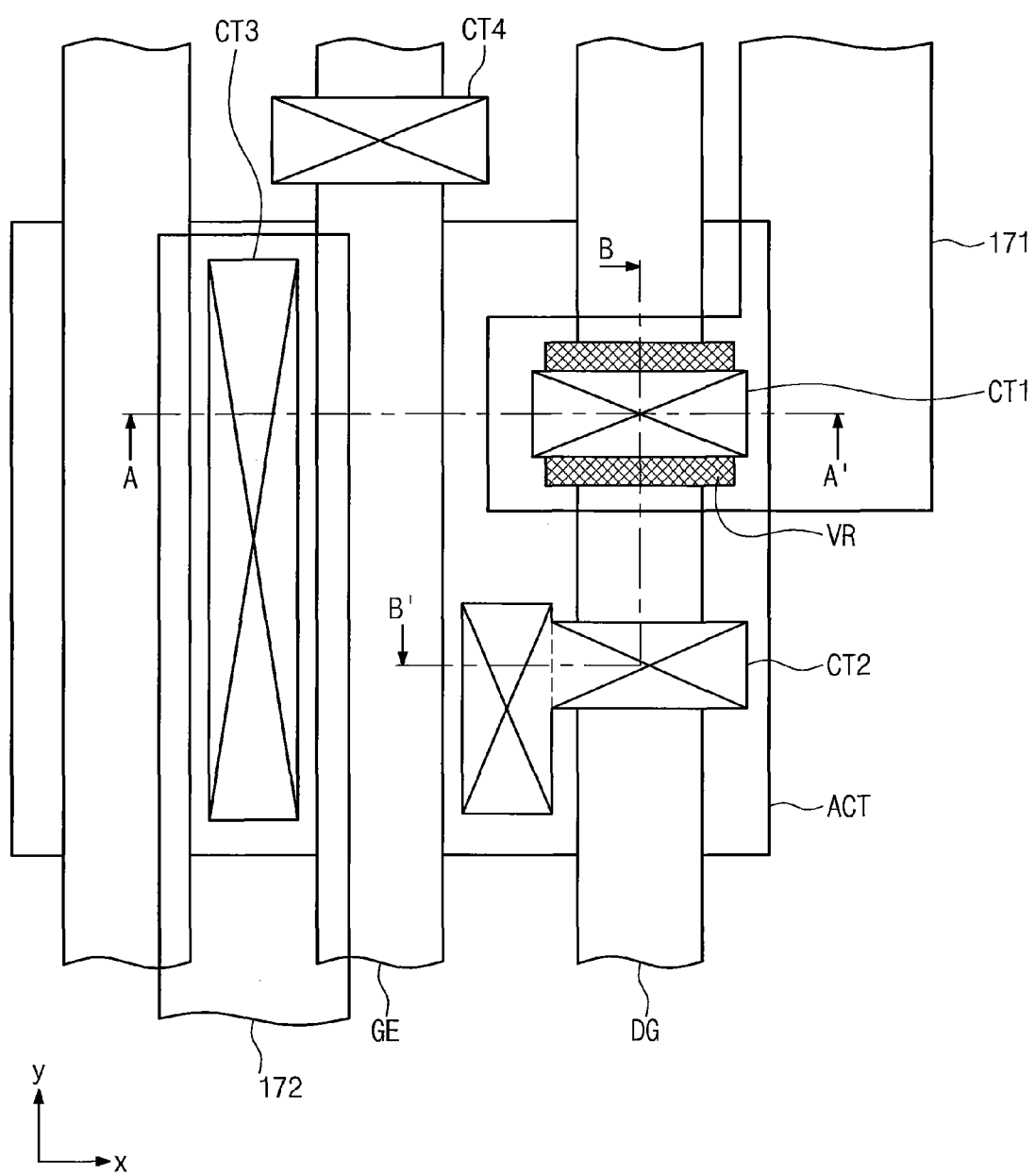
FIG. 2 is a plan view of a variable resistance memory device according to example embodiments of the inventive concepts.
Figure 3A:
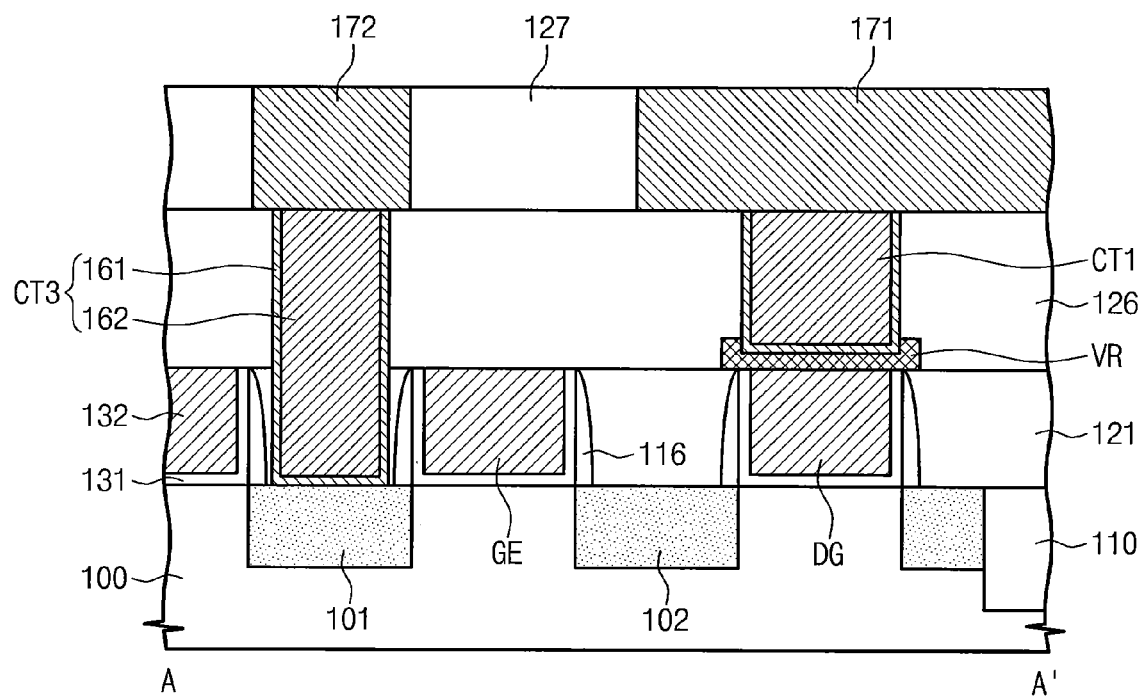
FIGS. 3A and 3B are sectional views taken along lines A-A' and B-B', respectively, of FIG. 2 to illustrate a variable resistance memory device according to example embodiments of the inventive concepts.
Figure 3B:
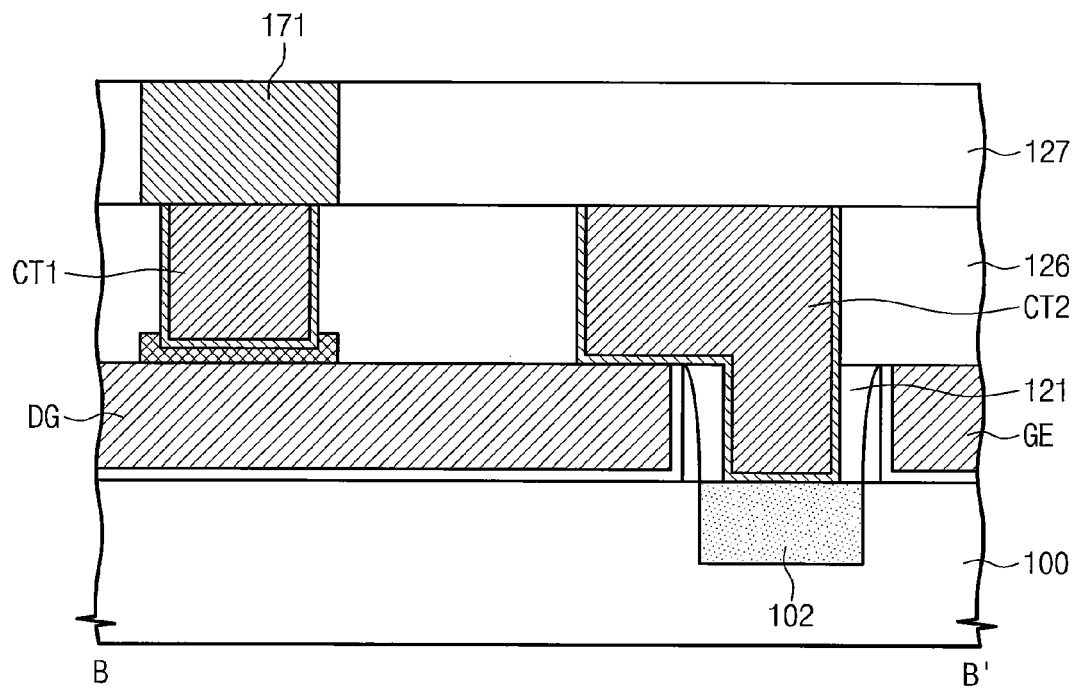

FIG. 2 is a plan view of a variable resistance memory device according to example embodiments of the inventive concepts. FIGS. 3A and 3B are sectional views taken along lines A-A' and B-B', respectively, of FIG. 2 to illustrate a variable resistance memory device according to example embodiments of the inventive concepts.

Referring to FIGS. 2, 3A, and 3B, gate patterns may be provided on an active region ACT of a substrate 100. The active region ACT may be an upper portion of the substrate 100 delimited or delineated by a device isolation layer 110. The device isolation layer 110 may include, for example, silicon oxide and/or silicon oxynitride.

The substrate 100 may be a semiconductor wafer (e.g., of silicon, germanium, or silicon-germanium) or a silicon-on-insulator (SOI) wafer. The gate patterns may include a cell gate pattern GE and a dummy gate pattern DG.

The dummy gate pattern DG may refer to a conductive pattern that is not or cannot be used as a gate electrode of a transistor, even though the dummy and cell gate patterns DG and GE may be formed using the same fabrication process and may be formed of the same material and at the same level. That is, the dummy and cell gate patterns DG and GE may be portions of a same material layer. For example, the cell gate pattern GE may be used as a gate electrode of a functional transistor structure with gate, source, and drain electrodes, while the dummy gate pattern DG may be a conductive pattern positioned as the gate electrode of an incomplete or non-functional transistor structure, in which at least one of source and drain electrodes is not provided. The incomplete or non-functional transistor structure means that impurity regions for the source and/or drain electrodes are not provided, or that the impurity regions for the source and/or drain electrodes are provided but no voltage is applied thereto (for example, due to an absence of a contact pattern for applying a voltage). In the present specification, a pair of the cell and dummy gate patterns GE and DG adjacent to each other will be described below, but the variable resistance memory device may be configured to include a plurality of cell gate patterns GE and a plurality of dummy gate patterns DG. For example, in FIG. 2, a gate pattern, which is spaced apart from the dummy gate pattern DG with the cell gate pattern GE interposed therebetween, may be used as a cell gate pattern or a dummy gate pattern.

The cell and dummy gate patterns GE and DG may be spaced apart from each other in a first direction (hereinafter, referred to as an x direction) and extend along a second direction (hereinafter, referred to as a y direction) crossing the first direction, but example embodiments of the inventive concepts may not be limited thereto. When viewed in plan view, first and second impurity regions 101 and 102 may be provided at opposite sides, respectively, of the cell gate pattern GE. The dummy gate pattern DG may be spaced apart from the cell gate pattern GE with the second impurity region 102 interposed therebetween.

One of the first and second impurity regions 101 and 102 may be a source region of a transistor, and the other a drain region. The first and second impurity regions 101 and 102 may be impurity regions with the same conductivity type. For example, in the case where the substrate 100 is of p-type, the first and second impurity regions 101 and 102 may be of n-type.

Each of the cell and dummy gate patterns GE and DG may include a gate insulating layer 131 and a gate electrode 132. For example, the gate insulating layer 131 may include at least one high-k dielectric material, whose dielectric constant is higher than that of silicon oxide. For example, the gate insulating layer 131 may include $HfO_2$, $ZrO_2$ or $Ta_2O_5$. The gate insulating layer 131 may be provided on or to cover bottom and side surfaces of the gate electrode 132. The gate electrode 132 may include a lower gate conductive layer and an upper gate conductive layer. For example, the lower gate conductive layer may include a conductive metal nitride layer (e.g., of TiN, TaN, or WN). The upper gate conductive layer may include a metal layer (e.g., of Ti, Ta, or W). In other example embodiments, the gate electrode 132 may be configured not to include the lower gate conductive layer. A spacer 116 may be provided on a sidewall of each of the cell and dummy gate patterns GE and DG. For example, the spacer 116 may include silicon oxide, silicon nitride, and/or silicon oxynitride. A first interlayer insulating layer 121 may be provided to cover or enclose the cell and dummy gate patterns GE and DG. The first interlayer insulating layer 121 may be formed to expose top surfaces of the cell and dummy gate patterns GE and DG. For example, the first interlayer insulating layer 121 may include silicon oxide.

A first contact pattern CT1 (also referred to herein as a gate contact pattern or dummy gate contact pattern) may be provided on the dummy gate pattern DG, and the variable resistance pattern VR may be provided between the dummy gate pattern DG and the first contact pattern CT1. For example, the variable resistance pattern VR may be in contact with the top surface of the dummy gate pattern DG. A bottom portion of the first contact pattern CT1 may be partially inserted into an upper portion of the variable resistance pattern VR. In other words, the variable resistance pattern VR may include a portion covering a bottom sidewall of the first contact pattern CT1. For the sake of simplicity, the description that follows will refer to an example of the present embodiment in which the variable resistance pattern VR and the first contact pattern CT1 have rectangular shapes or sections, but example embodiments of the inventive concepts may not be limited thereto.

The variable resistance pattern VR may be formed of one or more materials in which data can be stored. In example embodiments, the variable resistance pattern VR may include perovskite compounds and/or conductive metal oxides. For example, the variable resistance pattern VR may include niobium oxide, titanium oxide, nickel oxide, zirconium oxide, vanadium oxide, PCMO (($Pr,Ca)MnO_3$), strontium-titanium oxide, barium-strontium-titanium oxide, strontium-zirconium oxide, barium-zirconium oxide, and/or barium-strontium-zirconium oxide. In the case where the variable resistance pattern VR includes at least one transition metal oxide, the variable resistance pattern VR may have a dielectric constant larger than that of a silicon oxide layer. In other example embodiments, the variable resistance pattern VR may be provided in the form of a dual layered structure including a conductive metal oxide layer and a tunnel insulating layer or of a triple layered structure including a first conductive metal oxide layer, a tunnel insulating layer, and a second conductive metal oxide layer. The tunnel insulating layer may include aluminum oxide, hafnium oxide, or silicon oxide.

In still other example embodiments, the variable resistance pattern VR may be formed of or include one or more materials (for example, chalcogenides) whose electrical resistance can be changed using thermal energy applied thereto. For example, the variable resistance pattern VR may be formed of or include a material including antimony (Sb), tellurium (Te), and/or selenium (Se). For example, the variable resistance pattern VR may include a chalcogenide formed of tellurium (Te) having about 20-80 atomic percent concentration, antimony (Sb) having about 5-50 atomic percent concentration, and germanium (Ge) having the remaining concentration. In addition, the variable resistance pattern VR may further include N, O, C, Bi, In, B, Sn, Si, Ti, Al, Ni, Fe, Dy, and/or La as impurity contained therein. Alternatively, the variable resistance pattern VR may be formed of GeBiTe, InSb, GeSb, and/or GaSb.

A second interlayer insulating layer 126 may be provided on the first interlayer insulating layer 121 to cover or enclose the variable resistance pattern VR and the first contact pattern CT1. The second interlayer insulating layer 126 may include, for example, silicon oxide.

A second contact pattern CT2 may be provided to penetrate the first and second interlayer insulating layers 121 and 126 and may connect the dummy gate pattern DG electrically to the second impurity region 102. The second contact pattern CT2 may include a lower portion penetrating the first interlayer insulating layer 121 and being in contact with the second impurity region 102 and an upper portion penetrating the second interlayer insulating layer 126 and being in contact with the dummy gate pattern DG. Accordingly, the variable resistance pattern VR may be electrically connected to the second impurity region 102 via the dummy gate pattern DG and the second contact pattern CT2.

A third contact pattern CT3 may be provided through the first and second interlayer insulating layers 121 and 126 to be connected to the first impurity region 101. The third contact pattern CT3 may have a bar-shaped structure extending along the y direction, but example embodiments of the inventive concepts may not be limited thereto.

A fourth contact pattern CT4 may be provided in such a way that it is connected to the top surface of the cell gate pattern GE. A gate voltage may be applied to the cell gate pattern GE through the fourth contact pattern CT4.

Each of the contact patterns CT1-CT4 may include, for example, a barrier layer 161 and a metal layer 162. The barrier layer 161 may include a conductive metal nitride layer, such as a titanium nitride layer, a tungsten nitride layer, or a tantalum nitride layer. The metal layer 162 may include a metallic material, such as tungsten, titanium, or tantalum. In other example embodiments, at least one of the contact patterns CT1-CT4 may include a doped semiconductor material. In certain embodiments, the contact patterns CT1-CT4 may be simultaneously formed using the same process, thereby comprising portions of a same material layer and having top surfaces positioned at substantially the same level.

A third interlayer insulating layer 127 may be provided on the second interlayer insulating layer 126, and a first interconnection line 171 and a second interconnection line 172 may be provided in or on the third interlayer insulating layer 127. The first interconnection line 171 may be connected to the top surface of the first contact pattern CT1. In example embodiments, the first interconnection line 171 may be used as a bit line of the variable resistance memory device. The second interconnection line 172 may be connected to the top surface of the third contact pattern CT3. The first and second interconnection lines 171 and 172 may be formed of a metallic material (e.g., of copper or aluminum).

In the variable resistance memory device according to example embodiments of the inventive concepts, the variable resistance pattern VR may be provided between the dummy gate pattern DG and the first contact pattern CT1. Accordingly, even when an additional conductive layer for applying a voltage to the variable resistance pattern is not provided, it may still be possible to realize the variable resistance memory device.

FIGS. 4A through 10A are sectional views taken along line A-A' of FIG. 2 to illustrate methods of fabricating a variable resistance memory device according to example embodiments of the inventive concepts. FIGS. 4B through 10B are sectional views taken along line B-B' of FIG. 2.

Figure 4A:
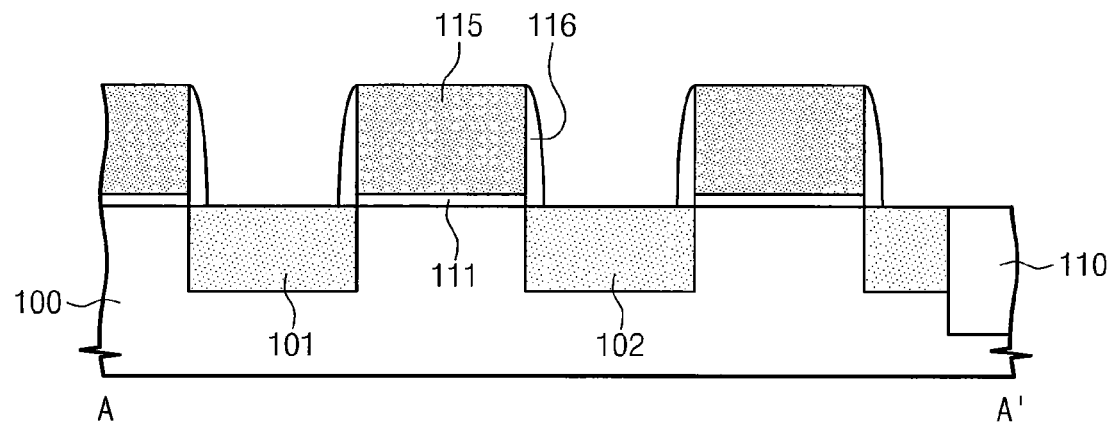
Figure 4B:
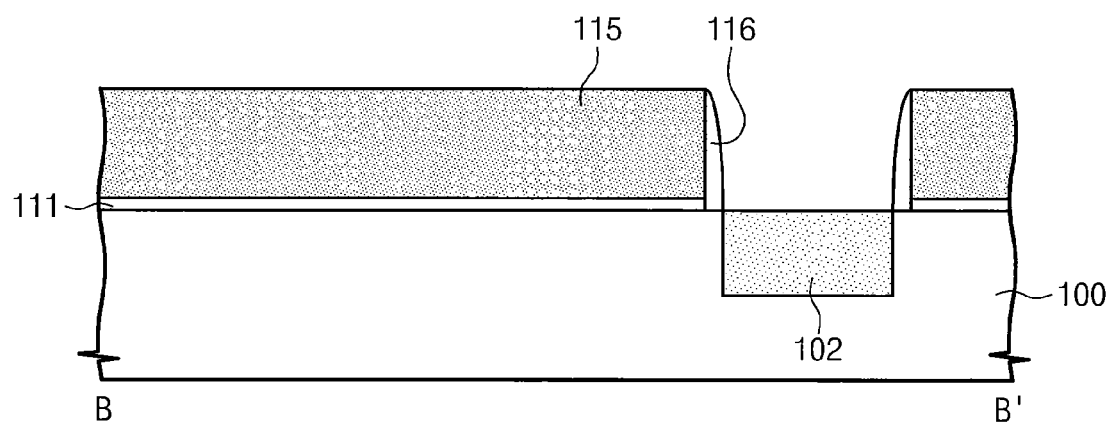

Referring to FIGS. 2, 4A, and 4B, a device isolation layer 110 may be formed on a substrate 100 to define an active region ACT, and sacrificial insulating patterns 111 and sacrificial gate patterns 115 may be formed on the substrate 100. The sacrificial insulating patterns 111 and the sacrificial gate patterns 115 may be sacrificial patterns, which will removed in a process of forming gate patterns. The sacrificial insulating and gate patterns 111 and 115 stacked on the substrate 100 may constitute or define sacrificial stacks that are spaced apart from each other in the x direction and extend along the y direction.

The sacrificial insulating patterns 111 may include silicon oxide. For example, the sacrificial insulating patterns 111 may be formed by performing a thermal oxidation process to the substrate 100. The sacrificial gate patterns 115 may include polysilicon. A spacer 116 may be formed on a sidewall of each of the sacrificial gate patterns 115. The formation of the spacer 116 may include forming an insulating layer to cover conformally the sacrificial gate patterns 115 and anisotropically etching the insulating layer. For example, the spacer 116 may include silicon oxide, silicon nitride, and/or silicon oxynitride. The sacrificial insulating patterns 111, the sacrificial gate patterns 115 and/or the spacer 116 may be formed using a chemical vapor deposition (CVD) or a physical vapor deposition (PVD) process.

First and second impurity regions 101 and 102 may be formed on the substrate 100 exposed by the sacrificial gate patterns 115. The first and second impurity regions 101 and 102 may be formed by an ion implantation process using the sacrificial gate patterns 115 as an ion mask. The first impurity region 101 and the second impurity region 102 may be regions that are doped with impurities to have the same conductivity type. For example, both of the first and second impurity regions 101 and 102 may be n-type.

Figure 5A:
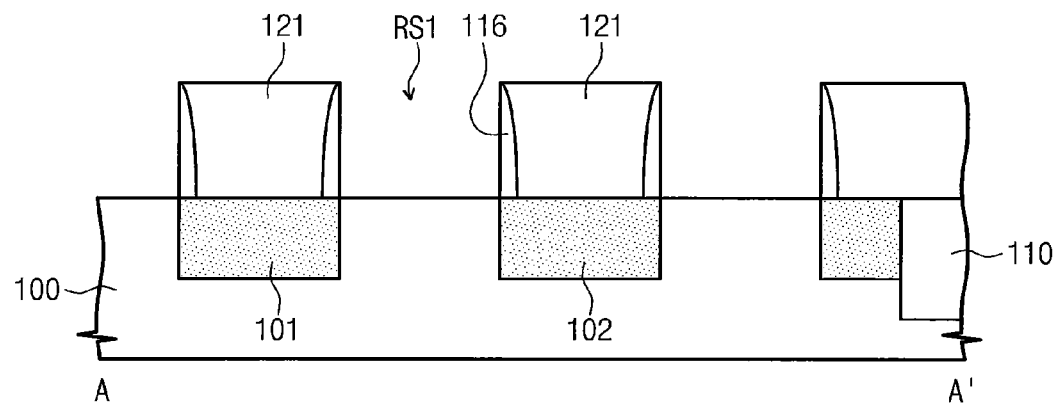
Figure 5B:
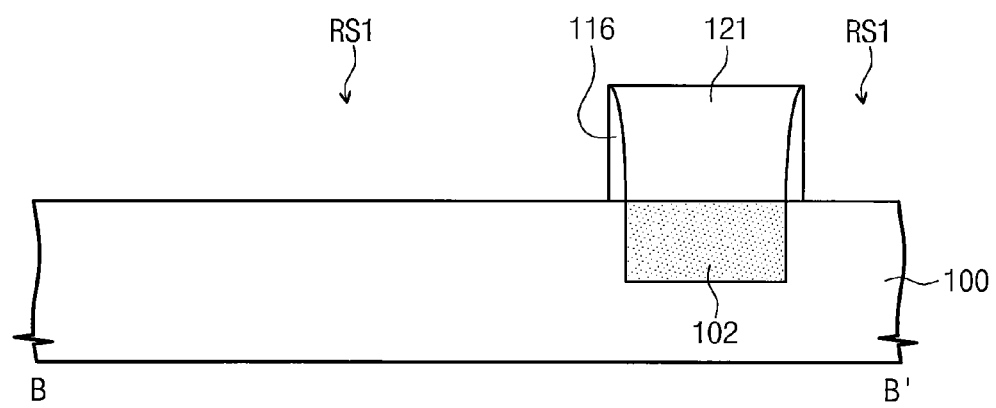

Referring to FIGS. 1, 5A, and 5B, a first interlayer insulating layer 121 may be formed to fill a gap region between the sacrificial gate patterns 115. The formation of the first interlayer insulating layer 121 may include a process of planarizing first interlayer insulating layer 121 to expose the sacrificial gate patterns 115. The first interlayer insulating layer 121 may include, for example, silicon oxide.

The sacrificial gate and insulating patterns 115 and 111 exposed by the first interlayer insulating layer 121 may be removed. A selective etching process may be performed at least one time during the removal of the sacrificial gate and insulating patterns 115 and 111. As the result of the removal of the sacrificial gate and insulating patterns 115 and 111, first recess regions RS1 may be formed in the first interlayer insulating layer 121.

Figure 6A:
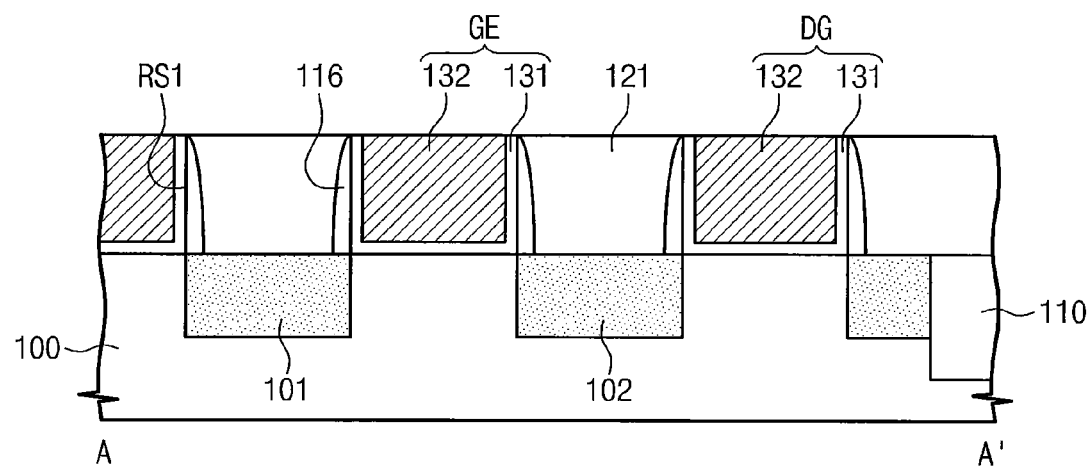
Figure 6B:
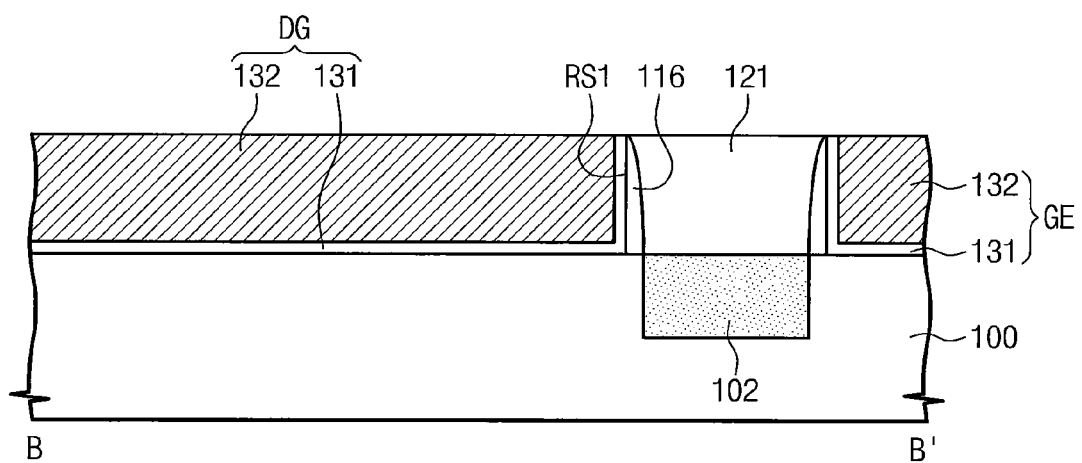

Referring to FIGS. 1, 6A, and 6B, a cell gate pattern GE and a dummy gate pattern DG may be formed in the first recess regions RS1. The cell gate pattern GE and the dummy gate pattern DG may be formed of the same material and by the same process. For example, the formation of the cell and dummy gate patterns GE and DG may include sequentially forming an insulating layer and a conductive layer on the resulting structure with the first recess regions RS1 and performing a planarization process to expose the first interlayer insulating layer 121. As a result, each of the cell and dummy gate patterns GE and DG may be formed to include a gate insulating layer 131 and a gate electrode 132. For example, the gate insulating layer 131 may include at least one high-k dielectric material, whose dielectric constant is higher than that of silicon oxide. For example, the gate insulating layer 131 may include $HfO_2$, $ZrO_2$, or $Ta_2O_5$. The gate electrode 132 may include metal and/or conductive metal nitride. The gate electrode 132 may include a lower gate conductive layer and an upper gate conductive layer in some embodiments. For example, the lower gate conductive layer may include a conductive metal nitride layer (e.g., TiN, TaN, or WN). The upper gate conductive layer may include a metal layer (e.g., Ti, Ta, or W). In other example embodiments, the gate electrode 132 may be formed not to include (that is, without) the lower gate conductive layer. The cell gate pattern GE and the dummy gate pattern DG may be formed using a chemical vapor deposition (CVD) or a physical vapor deposition (PVD) process.

Figure 7A:
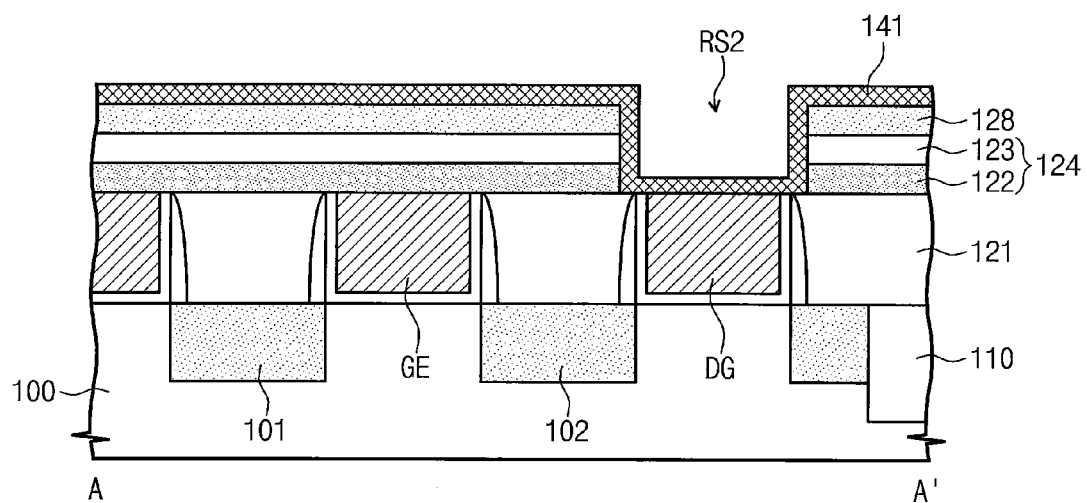
Figure 7B:
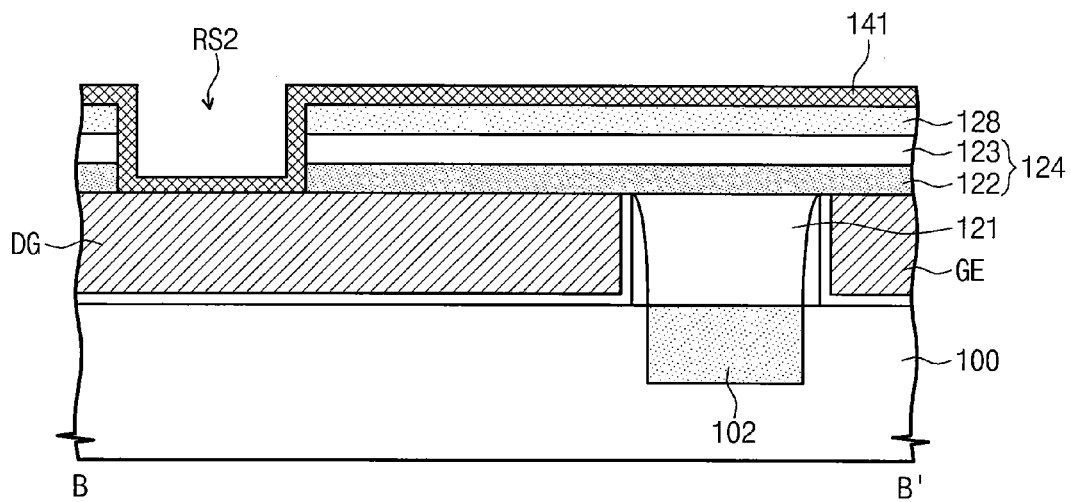

Referring to FIGS. 2, 7A, and 7B, a mask insulating layer 124 and a first mask pattern 128 may be sequentially formed on the first interlayer insulating layer 121, and then, the mask insulating layer 124 may be patterned using the first mask pattern 128 as an etch mask to form a second recess region RS2. The second recess region RS2 may be formed to expose a top surface of the dummy gate pattern DG. In certain embodiments, the first mask pattern 128 may be a photoresist pattern. The mask insulating layer 124 may include a first mask insulating layer 122 and a second mask insulating layer 123. The first mask insulating layer 122 may include a material having an etch selectivity with respect to the second mask insulating layer 123. For example, the first mask insulating layer 122 may include silicon nitride, and the second mask insulating layer 123 may include silicon oxide.

A variable resistance layer 141 may be formed on the resulting structure with the second recess region RS2. The variable resistance layer 141 may be formed to conformally cover side and bottom surfaces of the second recess region RS2. For example, the variable resistance layer 141 may be formed to be in contact with (that is, directly on) a top surface of the dummy gate pattern DG exposed by the second recess region RS2.

The variable resistance layer 141 may be formed of one or more materials in which data can be stored. In example embodiments, the variable resistance layer 141 may include perovskite compounds and/or conductive metal oxides. For example, the variable resistance layer 141 may include niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, and/or barium-strontium-zirconium oxide. In the case where the variable resistance layer 141 includes at least one transition metal oxide, the variable resistance layer 141 may have a dielectric constant larger than that of a silicon oxide layer. In other example embodiments, the variable resistance layer 141 may be formed to have a dual layered structure including a conductive metal oxide layer and a tunnel insulating layer or of a triple layered structure including a first conductive metal oxide layer, a tunnel insulating layer, and a second conductive metal oxide layer. The tunnel insulating layer may include aluminum oxide, hafnium oxide, or silicon oxide.

In still other example embodiments, the variable resistance layer 141 may be formed of or include one or more materials (for example, chalcogenides) whose electrical resistance can be changed using thermal energy applied thereto. For example, the variable resistance layer 141 may include a chalcogenide formed of tellurium (Te) having about 20-80 atomic percent concentration, antimony (Sb) having about 5-50 atomic percent concentration, and germanium (Ge) having the remaining concentration. In addition, the variable resistance layer 141 may further include N (nitrogen), O (oxygen), C (carbon), Bi (bismuth), In (indium), B (boron), Sn (tin), Si (silicon), Ti (titanium), Al (aluminum), Ni (nickel), Fe (iron), Dy (dysprosium), and/or La (lanthanum) as impurity contained therein. Alternatively, the variable resistance layer 141 may be formed of one of GeBiTe, InSb, GeSb, or GaSb. In example embodiments, the variable resistance layer 141 may be formed by a chemical vapor deposition process.

Figure 8A:
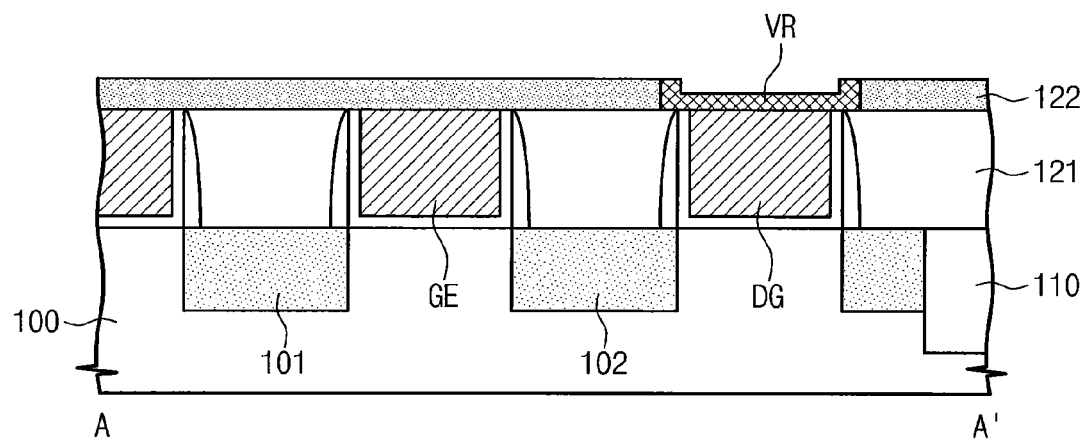
Figure 8B:
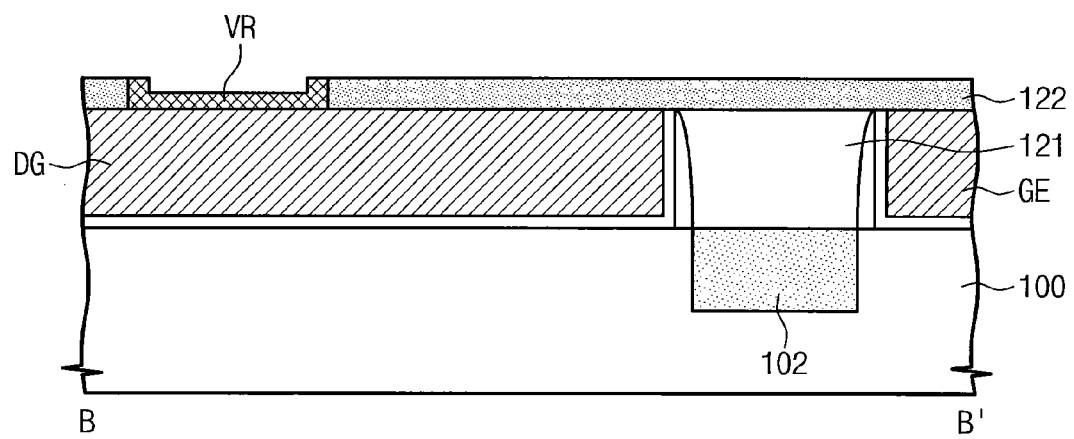

Referring to FIGS. 2, 8A, and 8B, the first mask pattern 128 may be removed, and then, the second mask insulating layer 123 may be selectively removed. During the removal of the first mask pattern 128 and the second mask insulating layer 123, the variable resistance layer 141 may be partially removed from the top surface of the first mask pattern 128 and from the sidewall of the second mask insulating layer 123, thereby forming a variable resistance pattern VR. Depending on a remaining thickness of the first mask insulating layer 122, the variable resistance pattern VR may be formed to have a recessed region, but example embodiments of the inventive concepts may not be limited thereto.

Figure 9A:
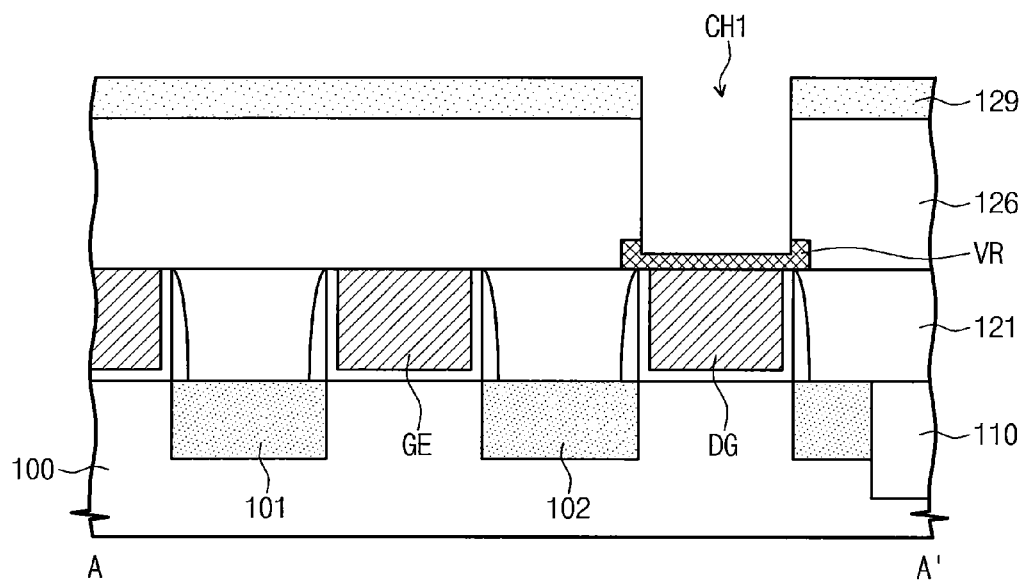
Figure 9B:
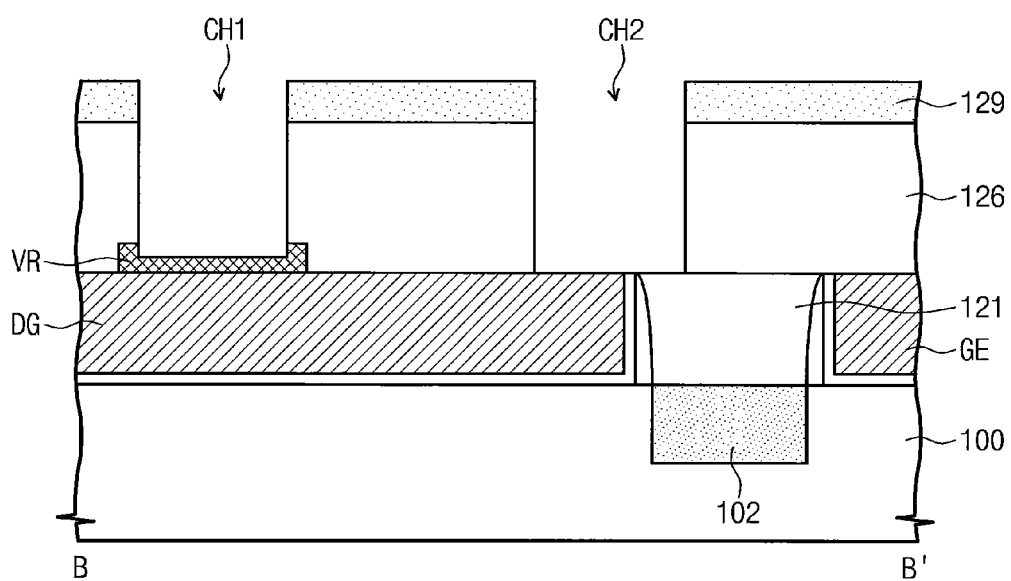

Referring to FIGS. 2, 9A, and 9B, the first mask insulating layer 122 may be removed and then a second interlayer insulating layer 126 may be formed to cover the variable resistance pattern VR. For example, the second interlayer insulating layer 126 may include a silicon oxide layer, which may be formed using a chemical vapor deposition process.

A second mask pattern 129 may be formed on the second interlayer insulating layer 126, and then, an etching process using this as an etch mask may be performed to form a first contact hole CH1 exposing the variable resistance pattern VR. In certain embodiments, the first contact hole CH1 may be formed by a dry etching process. Further, a second contact hole CH2 may be formed to expose a top surface of the dummy gate pattern DG. The second contact hole CH2 may be formed spaced apart from the first contact hole CH1. In certain embodiments, the first and second contact holes CH1 and CH2 may be formed at substantially the same time. The etching process for forming the first and second contact holes CH1 and CH2 may be performed to expose, for example, the dummy gate pattern DG.

Figure 10A:
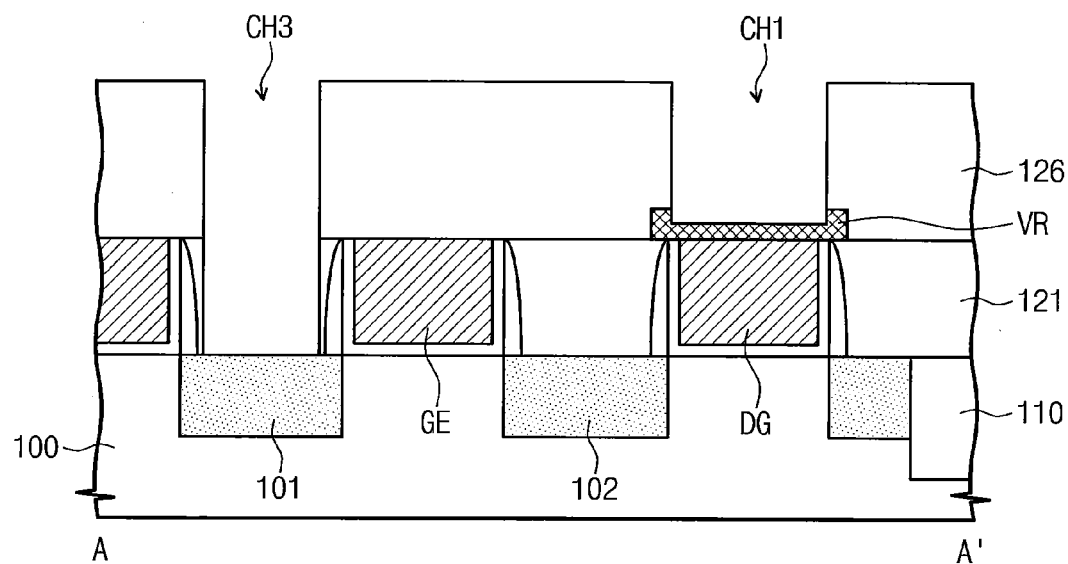
Figure 10B:
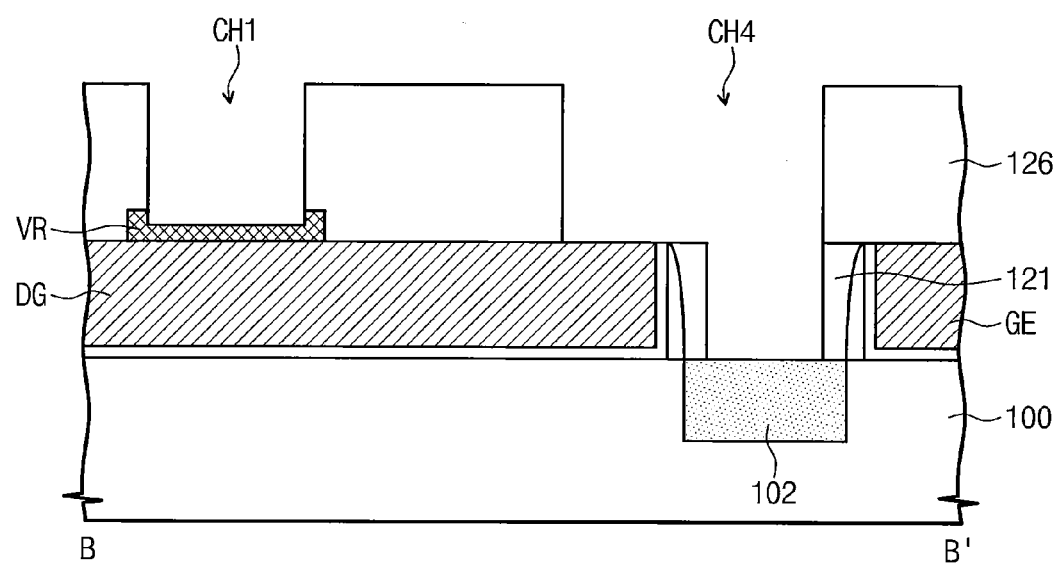

Referring to FIGS. 1, 10A, and 10B, the second mask pattern 129 may be removed, and then, third and fourth contact holes CH3 and CH4 may be formed to penetrate the first and second interlayer insulating layers 121 and 126 and expose the first and second impurity regions 101 and 102, respectively. The fourth contact hole CH4 may be formed in such a way that it is overlapped with the second contact hole CH2 to expose the second impurity region 102. In certain embodiments, the formation of the third and fourth contact holes CH3 and CH4 may include forming a sacrificial layer to fill the first and second contact holes CH1 and CH2, forming the third and fourth contact holes CH3 and CH4, and then, removing the sacrificial layer from the first and second contact holes CH1 and CH2.

Referring to FIGS. 2, 3A, and 3B, a first contact pattern CT1, a second contact pattern CT2, and a third contact pattern CT3 may be formed in the first contact hole CH1, the fourth contact hole CH4, and the third contact hole CH3, respectively. The formation of the contact patterns CT1, CT2, and CT3 may include forming a barrier layer 161 and a metal layer 162. The barrier layer 161 may include a conductive metal nitride layer, such as a titanium nitride layer, a tungsten nitride layer, and/or a tantalum nitride layer. The metal layer 162 may include a metallic material, such as tungsten, titanium, or tantalum. In other example embodiments, each of the contact patterns CT1, CT2, and CT3 may include a doped semiconductor material. In still other example embodiments, a metal-metal silicide layer may be formed between the second contact pattern CT2 and the second impurity region 102 and/or between the third contact pattern CT3 and the first impurity region 101.

A third interlayer insulating layer 127 may be formed on the second interlayer insulating layer 126, and first and second interconnection lines 171 and 172 may be formed in the third interlayer insulating layer 127. The first interconnection line 171 may be connected to the top surface of the first contact pattern CT1, and the second interconnection line 172 may be connected to the top surface of the third contact pattern CT3. Alternatively, the second contact pattern CT2 may be formed in such a way that it is not connected to any interconnection layer. The first and second interconnection lines 171 and 172 may be formed of a metal material (e.g., of copper or aluminum).

According to example embodiments of the inventive concepts, the variable resistance pattern VR may be formed before the formation of the interconnection lines or structures (for example, by the process of forming the gate and contact patterns). The gate and contact patterns may be formed of titanium, tungsten, and/or nitrides thereof, and such materials for the gate and contact patterns may exhibit higher material stability or better breakdown property to high voltage, compared with copper or aluminum that are usually used for the interconnection line. Accordingly, it may be possible to improve electrical or material characteristics (e.g., stability or breakdown) of the variable resistance memory device. This may make it possible to more quickly and/or easily fabricate the variable resistance memory device, which may be configured to have higher integration density and be able to realize various circuit arrangements, through a logic process.

Figure 11:
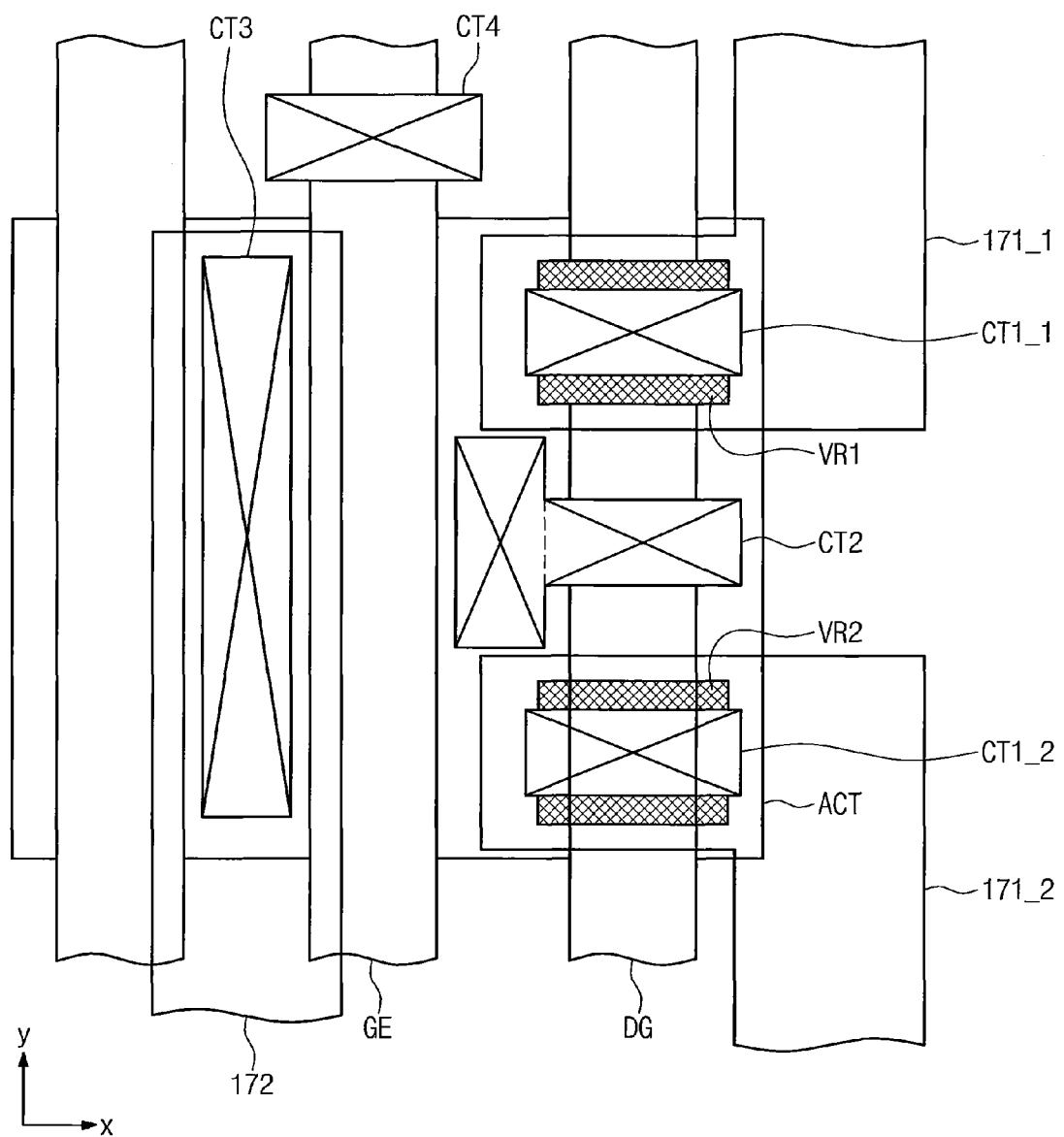
FIG. 11 is a plan view of a variable resistance memory device according to other example embodiments of the inventive concepts.

FIG. 11 is a plan view of a variable resistance memory device according to other example embodiments of the inventive concepts. For conciseness, a previously described element may be identified by a similar or identical reference number without repeating the description thereof.

Referring to FIG. 11, a variable resistance memory device according to the present embodiment may include a pair of variable resistance patterns VR1 and VR2 provided on the dummy gate pattern DG. The pair of variable resistance patterns VR1 and VR2 may be spaced apart from each other, in the y direction, with the second contact pattern CT2 interposed therebetween. First contact patterns CT1_1 and CT1_2 may be provided on the pair of variable resistance patterns VR1 and VR2, respectively, and first interconnection lines 171_1 and 171_2 may be provided on the first contact patterns CT1_1 and CT1_2, respectively.

In the variable resistance memory device according to FIG. 11, a plurality of memory layers may be provided on one terminal of one transistor. Accordingly, the variable resistance memory device may have an increased integration density.

Figure 12:
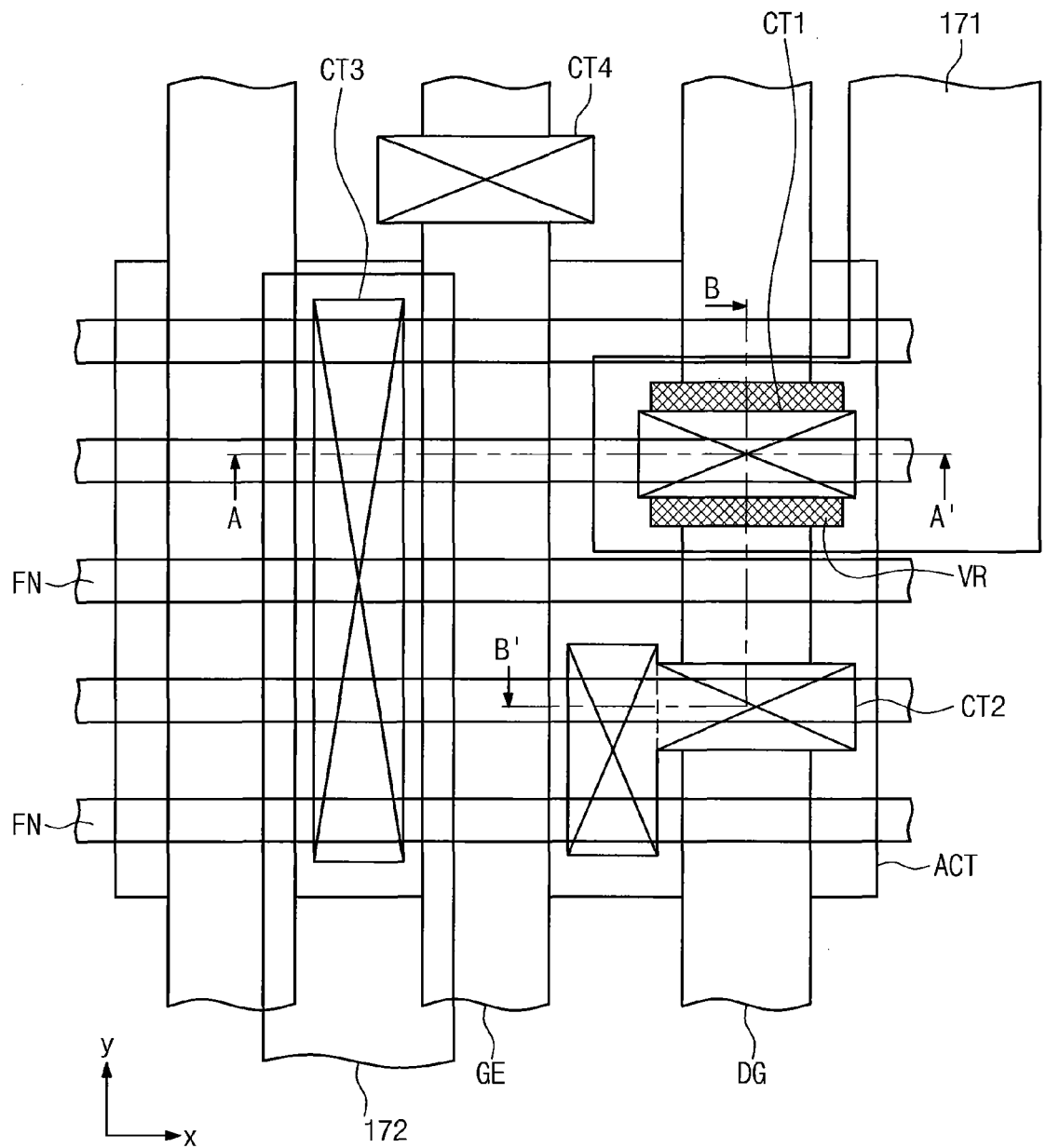
FIG. 12 is a plan view of a variable resistance memory device according to still other example embodiments of the inventive concepts.
Figure 13A:
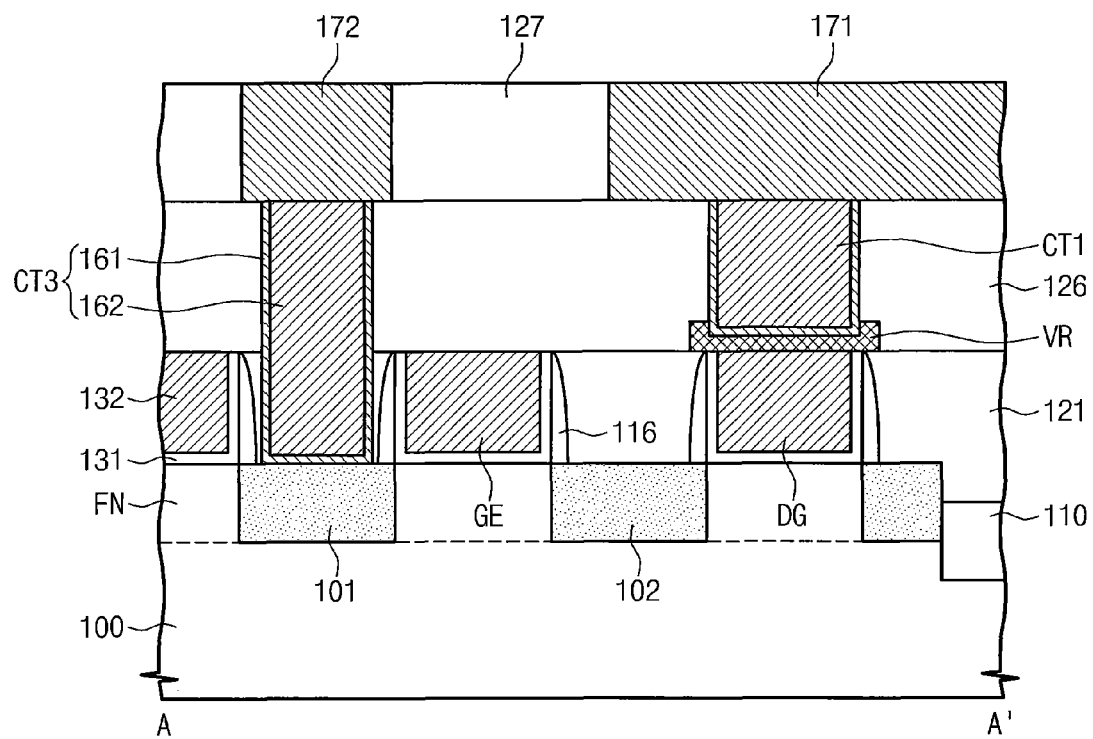
FIGS. 13A and 13B are sectional views taken along lines A-A' and B-B', respectively, of FIG. 12 to illustrate a variable resistance memory device according to still other example embodiments of the inventive concepts.
Figure 13B:
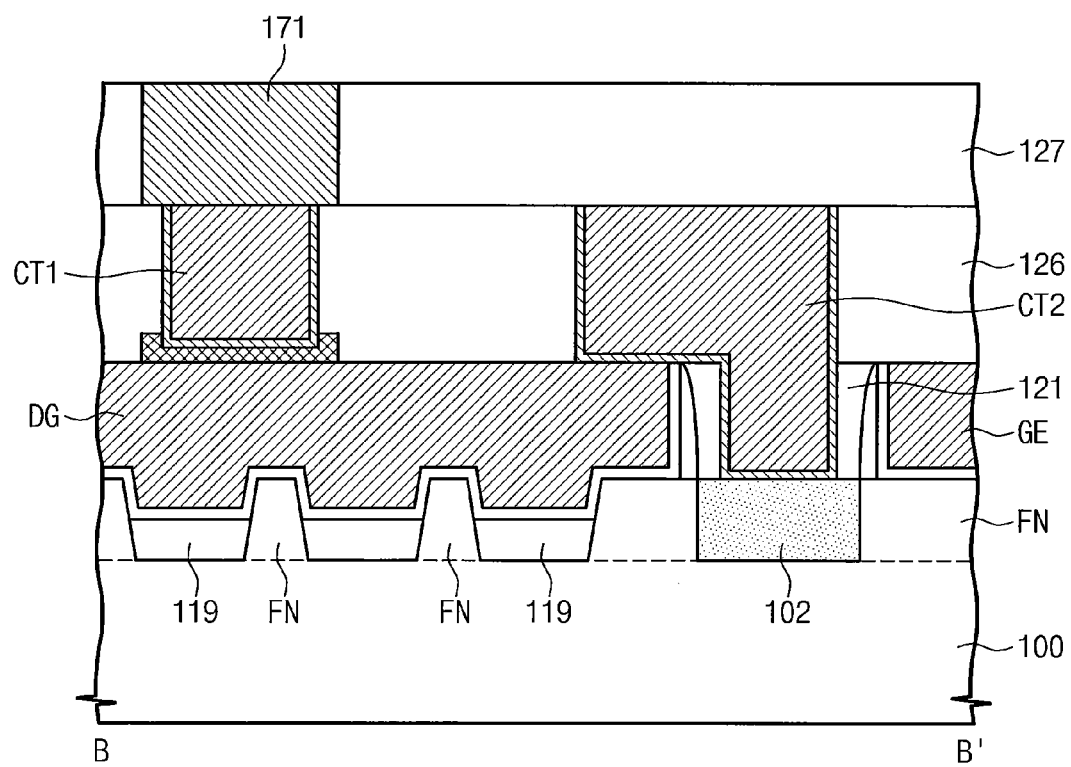

FIG. 12 is a plan view of a variable resistance memory device according to still other example embodiments of the inventive concepts. FIGS. 13A and 13B are sectional views taken along lines A-A' and B-B', respectively, of FIG. 12 to illustrate a variable resistance memory device according to still other example embodiments of the inventive concepts. For conciseness, a previously described element may be identified by a similar or identical reference number without repeating the description thereof.

Referring to FIGS. 12, 13A, and 13B, in the present embodiment, the variable resistance memory device may include active portions FN protruding from the substrate 100. The active portions FN may extend a direction (e.g., x direction) crossing the running direction (e.g., the y direction) of the gate patterns GE and DG. For example, recess regions may be formed on the substrate 100 to define shapes and positions of the active portions FN, and then, a device isolation layer 119 may be formed in lower portions of the recess regions. In other example embodiments, the active portions FN may be grown from the substrate 100 using an epitaxial process.

For example, the active portions FN may be provided to have a fin shape. As illustrated, the active portions FN may have a rectangular shape or section, but example embodiments of the inventive concepts may not be limited thereto. As an example, the active portions FN may be formed to have a lower width smaller than or greater than an upper width, when viewed in vertical section. In other example embodiments, the active portions FN may be spaced apart from the top surface of the substrate 100, and the cell gate pattern GE and/or the dummy gate pattern DG may be provided in the form of a nanowire or nanotube extending between the active portions FN and the substrate 100. For the sake of simplicity, the description that follows will refer to an example of the present embodiment in which the active portions FN have fin-shaped structures, but example embodiments of the inventive concepts may not be limited thereto.

The device isolation layer 119 may have a top surface that is lower than that of the active portions FN. In this case, since the dummy gate pattern DG extends along the active portions FN and the device isolation layer 119, a bottom surface thereof may have an uneven profile.

The first and second impurity regions 101 and 102 may be formed in the active portions FN. In certain embodiments, the formation of the first and second impurity regions 101 and 102 may include partially removing the active portions FN and performing an epitaxial process to form a layer, which is made of the same material as or a different material (e.g., silicon-germanium (SiGe)) from the substrate 100.

Except for these differences, the variable resistance memory device according to the present embodiment may be configured to have substantially the same features as that of the previous embodiments described with reference to FIGS. 2, 3A, and 3B.

Figure 14:
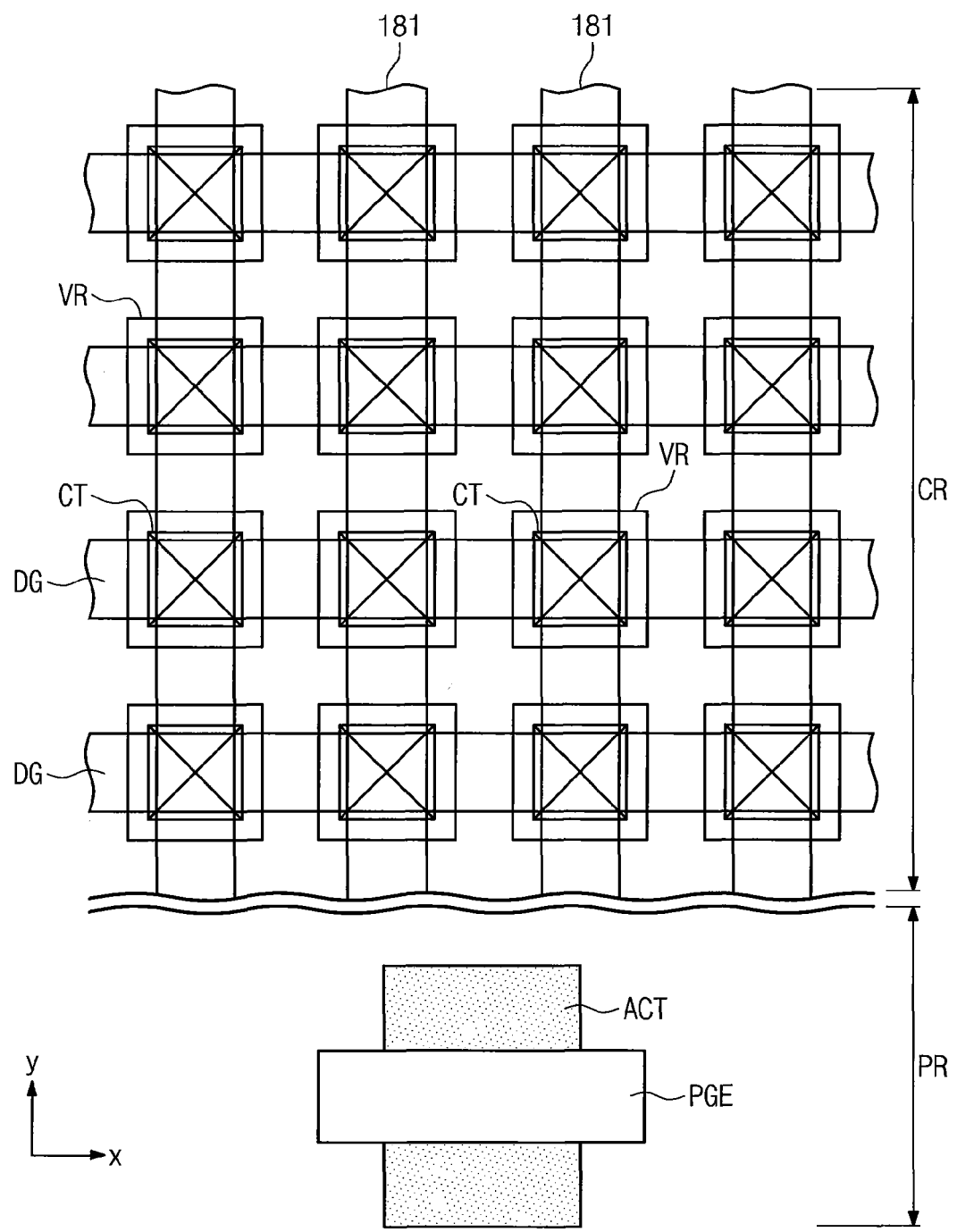
FIG. 14 is a plan view of a variable resistance memory device according to even other example embodiments of the inventive concepts.

FIG. 14 is a plan view of a variable resistance memory device according to even other example embodiments of the inventive concepts. For conciseness, a previously described element may be identified by a similar or identical reference number without repeating the description thereof.

Referring to FIG. 14, the variable resistance memory device according to the present embodiment may include a cell array region CR and a peripheral circuit region PR. A plurality of memory cells and bit and word lines serving as electrical connection pathways to the memory cells may be provided in the cell array region CR. Peripheral circuits for controlling operations of the memory cells may be provided in the peripheral circuit region PR. For example, a decoder block and a sense amplifier block may be provided in the peripheral circuit region PR.

A peripheral gate pattern PGE may be provided on the active region ACT of the peripheral circuit region PR. The peripheral gate pattern PGE may be one of gate electrodes of functional transistors provided in the peripheral circuit region PR. A dummy gate patterns DG may be provided in the cell array region CR. The dummy gate patterns DG and the peripheral gate pattern PGE may be simultaneously formed using the same process, thereby having the same material and being located at substantially the same level from the substrate, but the dummy gate patterns DG may be a conductive pattern that is not or cannot be used as a gate electrode of a transistor.

The dummy gate patterns DG may be spaced apart from each other in the y direction and have a linear or line-shaped structure extending along the x direction. First conductive patterns 181 may be provided on the dummy gate patterns DG. For example, the first conductive patterns 181 may serve as bit lines. Respective variable resistance patterns VR may be provided between the dummy gate patterns DG and the first conductive patterns 181. The variable resistance patterns VR may be provided at respective intersections between the dummy gate patterns DG and the first conductive patterns 181.

The contact patterns CT may be provided between the variable resistance patterns VR and the first conductive patterns 181. The dummy gate pattern DG and the contact pattern CT may serve as bottom and top electrodes, respectively, in operation of the variable resistance memory device according to the present embodiment.

Figure 15:
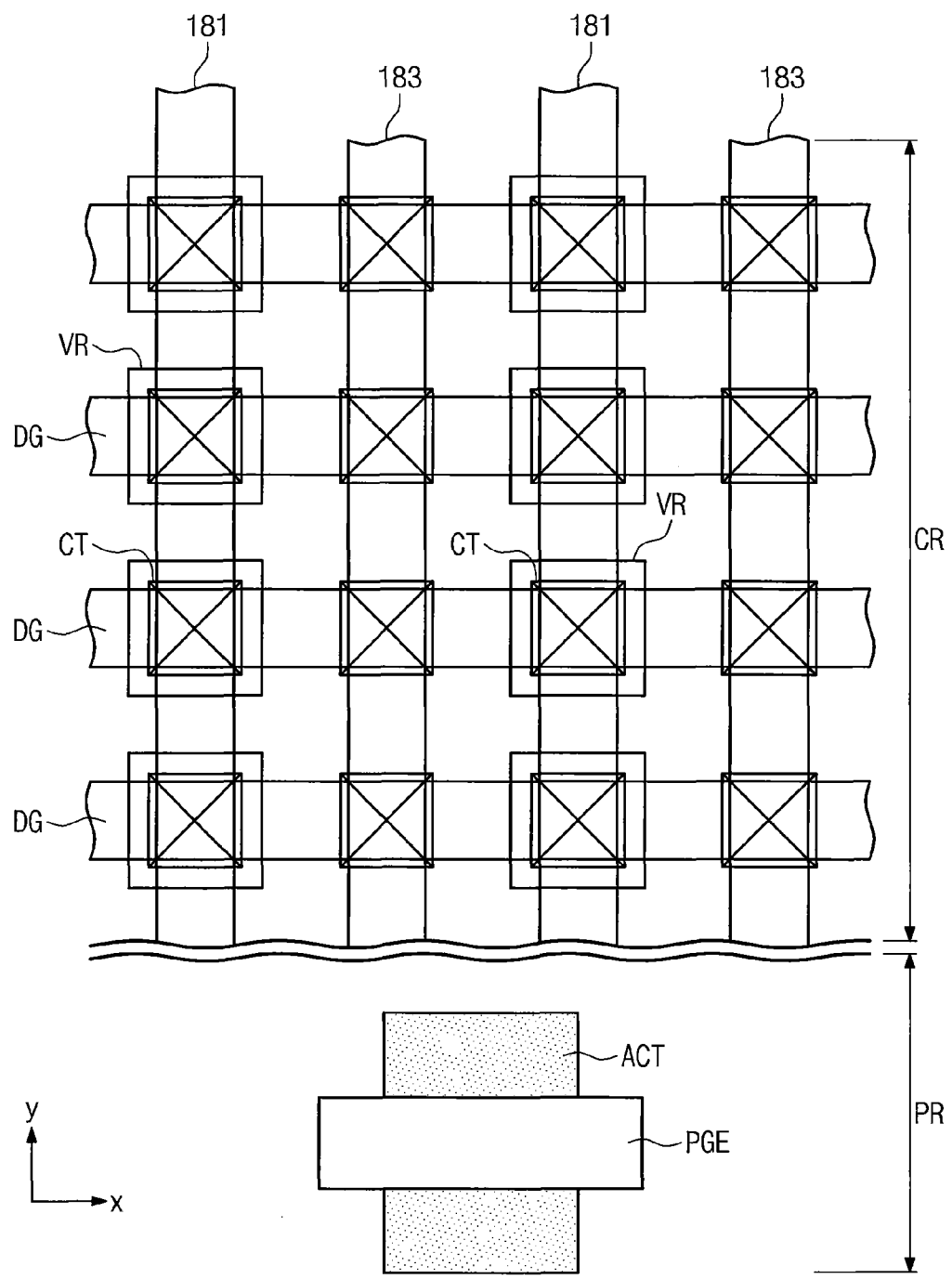
FIG. 15 is a plan view of a variable resistance memory device according to yet other example embodiments of the inventive concepts.

FIG. 15 is a plan view of a variable resistance memory device according to yet other example embodiments of the inventive concepts. For conciseness, a previously described element may be identified by a similar or identical reference number without repeating the description thereof.

Referring to FIG. 15, in the present embodiment, the variable resistance memory device may include conductive patterns extending along the y direction to cross the dummy gate patterns DG. For example, the conductive patterns may include the first conductive patterns 181, which are odd-numbered ones of the conductive patterns, and second conductive patterns 183, which are even-numbered ones of the conductive patterns. In other words, the first conductive patterns 181 and the second conductive patterns 183 may be alternatingly arranged in the x direction.

In the present embodiments, pairs of the variable resistance pattern VR and the contact pattern CT may be provided at respective intersections between the first conductive patterns 181 and the dummy gate patterns DG, but the variable resistance patterns VR may not be provided at intersections between the second conductive patterns 183 and the dummy gate patterns DG. For example, the second conductive patterns 183 may serve as strapping patterns for reducing electrical resistance between the dummy gate patterns DG and the peripheral region.

Figure 16:
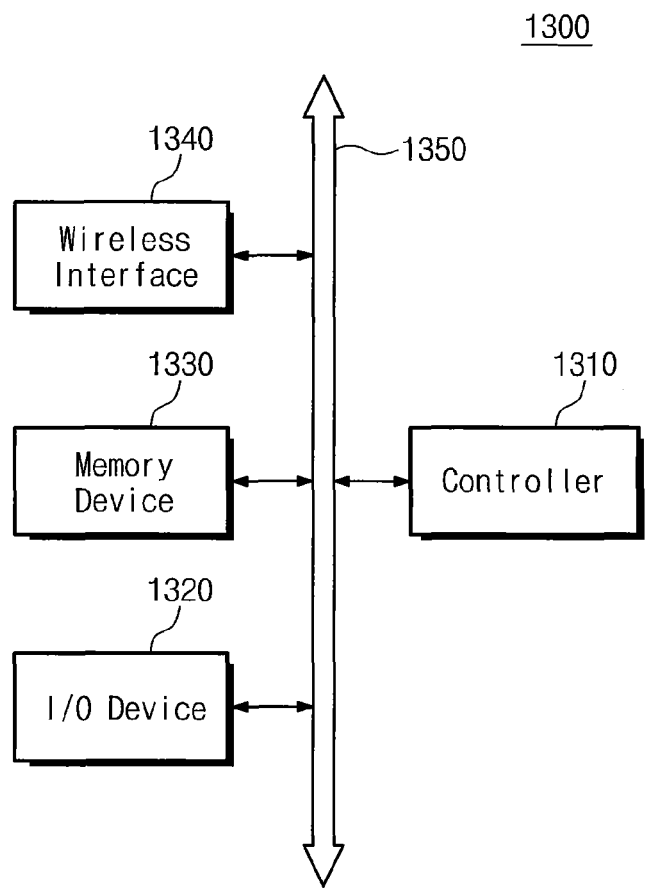
FIGS. 16 and 17 are block diagrams schematically illustrating electronic devices including a variable resistance memory device according to example embodiments of the inventive concepts.
Figure 17:
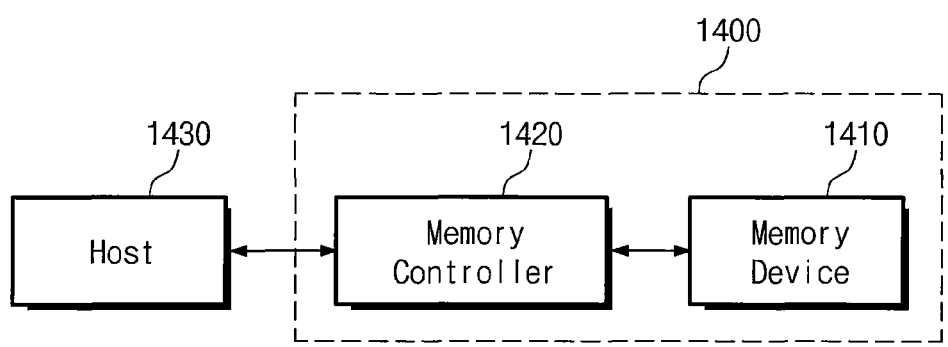

FIGS. 16 and 17 are block diagrams schematically illustrating electronic devices including variable resistance memory devices according to example embodiments of the inventive concepts.

Referring to FIG. 16, an electronic device 1300 including variable resistance memory devices according to example embodiments of the inventive concepts may be used in one of a personal digital assistant (PDA), a laptop computer, a mobile computer, a web tablet, a wireless phone, a cell phone, a digital music player, a wired or wireless electronic device, and/or a complex electronic device including a combination of such functionalities. The electronic device 1300 may include a controller 1310, an input/output device (s) 1320 (such as a keypad, a keyboard, a display, etc.), a memory 1330, and/or a wireless interface 1340 that are connected/coupled to each other through a bus 1350. The controller 1310 may include, for example, at least one microprocessor, a digital signal process, a microcontroller, etc. The memory 1330 may be configured to store a command code to be used by the controller 1310 and/or user data. The memory 1330 may include variable resistance memory devices according to example embodiments of inventive concepts. The electronic device 1300 may use a wireless interface 1340 configured to transmit data to and/or receive data from a wireless communication network using a RF (radio frequency) signal. The wireless interface 1340 may include, for example, an antenna, a wireless transceiver, etc. The electronic device 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 17, a memory system including a variable resistance memory device according to example embodiments of inventive concepts will be described. The memory system 1400 may include a memory device 1410 for storing relatively large quantities of data and a memory controller 1420. The memory controller 1420 controls the memory device 1410 so as to read data stored in the memory device 1410 and/or to write data into the memory device 1410 in response to a read/write request of or from a host 1430. The memory controller 1420 may include an address mapping table for mapping an address provided from the host 1430 (e.g., a mobile device or a computer system) into a physical address of the memory device 1410. The memory device 1410 may include one or more variable resistance memory devices according to example embodiments of inventive concepts.

The variable resistance memory devices disclosed above may be encapsulated using various and diverse packaging techniques. For example, variable resistance memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and/or a wafer-level processed stack package (WSP) technique.

The package in which the variable resistance memory device according to one of the above embodiments is mounted may further include at least one semiconductor device (e.g., a controller and/or a logic device) that controls the variable resistance memory device.

According to example embodiments of the inventive concepts, the variable resistance pattern may be provided between the dummy gate pattern and the first contact pattern. Accordingly, even when an additional conductive layer for applying a voltage to the variable resistance pattern is not provided, it is possible to realize the variable resistance memory device. In addition, the variable resistance pattern may be formed before the formation of the interconnection structure (for example, by the process of forming the gate and contact patterns). Accordingly, it is possible to realize the variable resistance memory device with improved endurance and stability.

While example embodiments of the inventive concepts have been particularly shown and described, it will be understood by one of ordinary skill in the art that variations in form and detail may be made therein without departing from the spirit and scope of the attached claims.

What is claimed is:

1. A variable resistance memory device, comprising:
a gate pattern and a dummy gate pattern extending adjacent one another at a same level on a substrate;
a first contact pattern on the dummy gate pattern; and
a variable resistance pattern between the dummy gate pattern and the first contact pattern.

2. The device of claim 1, further comprising:
an active portion of the substrate below the gate pattern and the dummy gate pattern, wherein the active portion has a fin shape protruding from a top surface of the substrate.

3. The device of claim 1, wherein the dummy gate pattern defines a gate pattern of a non-functional transistor having only one source/drain region, or having at least one source/drain region that is electrically isolated from an external voltage source.

4. The device of claim 1, further comprising:
source and drain regions at both sides of the gate pattern, wherein the variable resistance pattern is electrically connected to one of the source and drain regions via the dummy gate pattern.

5. The device of claim 4, further comprising:
a second contact pattern connected to one of the source and drain regions, wherein the variable resistance pattern is electrically connected to the one of the source and drain regions via the dummy gate pattern and the second contact pattern.

6. The device of claim 5, wherein the second contact pattern comprises:
a lower portion connected to the one of the source and drain regions; and
an upper portion connected to an upper portion of the dummy gate pattern.

7. The device of claim 5, wherein the variable resistance pattern comprises a first variable resistance pattern and a second variable resistance pattern, disposed on the dummy gate pattern, respectively, and when viewed in plan view, the second contact pattern is on the dummy gate pattern between the first and second variable resistance patterns.

8. The device of claim 1, wherein the dummy gate pattern is in a cell region of the substrate, and the gate pattern is in a peripheral circuit region of the substrate.

9. The device of claim 8, wherein in the variable resistance memory device:
the variable resistance pattern, the dummy gate pattern, and the first contact pattern comprise two or more variable resistance patterns, dummy gate patterns, and first contact patterns, respectively;
the variable resistance memory device further comprises conductive patterns that cross the dummy gate patterns; and
the variable resistance patterns are at respective intersections between the dummy gate patterns and the conductive patterns.

10. The device of claim 9, wherein the conductive patterns comprise:
   first conductive patterns, wherein the variable resistance patterns are between the first conductive patterns and the dummy gate patterns; and
   second conductive patterns, wherein no variable resistance patterns are between the second conductive patterns and the dummy gate patterns.

11. The device of claim 10, wherein the first conductive patterns and the second conductive patterns are alternatingly disposed on the substrate in plan view.

12. The device of claim 1, further comprising:
   a first interconnection line on the first contact pattern, wherein the variable resistance pattern has a top surface lower than a bottom surface of the first interconnection line.

13. A variable resistance memory device, comprising:
   a substrate;
   a gate pattern and a dummy gate pattern on a surface of the substrate, the gate and dummy gate patterns defining conductive electrodes of functional and non-functional transistors, respectively;
   a variable resistance material pattern on the dummy gate pattern opposite the substrate; and
   a contact pattern on the variable resistance material pattern opposite the dummy gate pattern, wherein the contact pattern and the dummy gate pattern define upper and lower electrodes on the variable resistance material pattern, respectively.

14. The device of claim 13, wherein the gate pattern and the dummy gate pattern extend substantially in parallel on the surface of the substrate and comprise respective portions of a same conductive material layer.

15. The device of claim 14, further comprising:
   an insulating interlayer on the gate pattern and the dummy gate pattern, wherein the contact pattern comprises a first contact pattern extending through the insulating interlayer to contact the variable resistance material pattern opposite the dummy gate; and
   a second contact pattern extending through the insulating interlayer to contact the dummy gate pattern and a source/drain region of the functional transistor.

16. The device of claim 15, further comprising:
   a third contact pattern extending through the insulating interlayer to contact another source/drain region of the functional transistor.

17. The device of claim 16, wherein the first, second, and third contact patterns comprise portions of a same conductive layer, and wherein the first contact pattern contacts the variable resistance material pattern at opposing sidewalls thereof.

18. The device of claim 16, wherein the gate pattern and the dummy gate pattern extend in a first direction, and further comprising:
   a first interconnection line contacting the first contact pattern opposite the variable resistance material pattern and extending in a second direction on a surface of the insulating interlayer.

19. The device of claim 18, wherein the first interconnection line comprises a bit line of the memory device, and wherein the dummy gate pattern is coupled to a ground voltage.

20. The device of claim 18, further comprising:
   a second interconnection line contacting the third contact pattern opposite the another source/drain region and extending in the first direction on the surface of the insulating interlayer,
   wherein the first, second, and third contact patterns comprise titanium, tungsten, and/or nitrides thereof, and wherein the first and second interconnection lines comprise copper and/or aluminum.

* * * * *